(12) United States Patent
Ryu et al.

(10) Patent No.: US 10,181,367 B2
(45) Date of Patent: Jan. 15, 2019

(54) RESISTOR ELEMENT, METHOD OF MANUFACTURING THE SAME, AND RESISTOR ELEMENT ASSEMBLY

(71) Applicant: SAMSUNG ELECTRO-MECHANICS CO., LTD., Suwon-si, Gyeonggi-do (KR)

(72) Inventors: Heung Bok Ryu, Suwon-si (KR); Teack Yong Nam, Suwon-si (KR); Yong Joo Lee, Suwon-si (KR); Sung Gil Gu, Suwon-si (KR); Jung Min Nam, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/992,505

(22) Filed: May 30, 2018

(65) Prior Publication Data
US 2018/0277287 A1    Sep. 27, 2018

Related U.S. Application Data

(63) Continuation of application No. 15/728,977, filed on Oct. 10, 2017, now Pat. No. 10,008,310.

(30) Foreign Application Priority Data

Feb. 13, 2017   (KR) .................. 10-2017-0019591

(51) Int. Cl.
*H01C 1/16*      (2006.01)
*H01C 1/02*      (2006.01)
(Continued)

(52) U.S. Cl.
CPC .............. *H01C 1/16* (2013.01); *H01C 1/012* (2013.01); *H01C 1/02* (2013.01); *H01C 1/142* (2013.01);
(Continued)

(58) Field of Classification Search
CPC .......... H01C 1/16; H01C 7/006; H01C 7/003; H05K 2201/10022
(Continued)

(56) References Cited

U.S. PATENT DOCUMENTS 6,097,276 A * 8/2000 Van Den Broek ....... H01C 7/06
                                                          338/22 R
8,098,127 B2   1/2012 Tchaplia
(Continued)

FOREIGN PATENT DOCUMENTS

JP    H01-155601 A    6/1989
JP    H02-82003 U     6/1990
(Continued)

OTHER PUBLICATIONS

Notice of Allowance issued in U.S. Appl. No. 15/728,977, dated Mar. 1, 2018.
(Continued)

*Primary Examiner* — Sherman Ng
(74) *Attorney, Agent, or Firm* — McDermott Will & Emery LLP

(57) ABSTRACT

A resistor element includes a first terminal and a second terminal disposed on opposite end portions of a base substrate, respectively. A first resistance layer is connected to the first terminal and formed of a thick film resistor, and a second resistance layer is connected to the first resistance layer and the second terminal and is formed of a thin film resistor.

16 Claims, 7 Drawing Sheets

(51) Int. Cl.
*H01C 1/012* (2006.01)
*H01C 7/00* (2006.01)
*H01C 17/28* (2006.01)
*H01C 17/00* (2006.01)
*H01C 17/065* (2006.01)
*H05K 1/11* (2006.01)
*H01C 1/142* (2006.01)
*H01C 17/075* (2006.01)
*H05K 1/18* (2006.01)

(52) U.S. Cl.
CPC ............. *H01C 7/003* (2013.01); *H01C 7/006* (2013.01); *H01C 17/006* (2013.01); *H01C 17/065* (2013.01); *H01C 17/075* (2013.01); *H01C 17/281* (2013.01); *H05K 1/111* (2013.01); *H05K 1/181* (2013.01); *H05K 2201/10022* (2013.01)

(58) Field of Classification Search
USPC ........................................................ 174/260
See application file for complete search history.

(56) References Cited

U.S. PATENT DOCUMENTS

2012/0235782 A1  9/2012  Chen

2013/0154790 A1* 6/2013  Park .................. H01C 17/06526
                                                                 338/309
2016/0372242 A1* 12/2016  Lee .......................... H01C 1/14
2017/0179217 A1  6/2017  Han et al.

FOREIGN PATENT DOCUMENTS

| JP | H04-147601 A | 5/1992 |
| JP | H07-094308 A | 4/1995 |
| JP | H07201529 A | 8/1995 |
| JP | 2003-217903 A | 7/2003 |
| JP | 2004-031800 A | 1/2004 |
| JP | 2005-332870 A | 12/2005 |
| JP | 2010-199283 A | 9/2010 |

OTHER PUBLICATIONS

Notice of Reason for Rejection issued in Japanese Patent Application No. 10-2017-0019591, dated Jul. 20, 2018 (English translation).

Notice of Office Action issued in Japanese Patent Application No. 2017-197807, dated Sep. 11, 2018 (English translation).

* cited by examiner

I-I'

II-II'

RESISTOR ELEMENT, METHOD OF MANUFACTURING THE SAME, AND RESISTOR ELEMENT ASSEMBLY

CROSS-REFERENCE TO RELATED APPLICATION(S)

This application is a continuation of U.S. patent application Ser. No. 15/728,977, filed Oct. 10, 2017 which claims the benefit under 35 U.S.C. § 119 (a) of priority to Korean Patent Application No. 10-2017-0019591 filed on Feb. 13, 2017 in the Korean Intellectual Property Office, the entire disclosures of both are incorporated herein by reference for all purposes.

BACKGROUND

1. Field

The following description relates to a resistor element, a method of manufacturing the same, and a resistor element assembly.

2. Description of Related Art

In response to demand for miniaturized and light weight electronic devices, chip-type resistor elements have been used to increase wiring density of the circuit board. In addition, as power requirements for electronic devices have increased, circuits for detecting an overcurrent and a state of charge (SoC) of a battery have been introduced to electronic devices, such that a resistor element having a high degree of precision is required.

A thick film resistor element is manufactured by a relatively simple process, but has a difficulty implementing precision at a predetermined level or more due to characteristics of the resistive material constituting the film resistor and due to the manufacturing process. The specific resistance and temperature coefficient of resistivity (TCR) of the resistive material are high and thermoelectromotive force generated in a trimming process can cause an error in the resistance value.

A thin film resistor element using a thin film resistor has been developed in order to manufacture a resistor element having high precision, but has difficultly implementing a high resistance value (for example, 100 KΩ or more) due to limitations in the manufacturing process, such that it may be difficult to secure diversity in products.

SUMMARY

An aspect of the present disclosure may provide a resistor element having a high resistance value and improved precision.

According to an aspect of the present disclosure, a resistor element may include a first terminal and a second terminal on opposite end portions of a base substrate, respectively. A first resistance layer may be electrically connected to the first terminal and comprise a thick film resistor. A second resistance layer may be electrically connected to the first resistance layer and the second terminal and comprise a thin film resistor.

Another aspect of the present disclosure is a method of manufacturing a resistor element. The method may include preparing a base substrate. A first internal electrode and a second internal electrode may be formed on opposite end portions of the base substrate, respectively. A first resistance layer may be formed to be connected to the first internal electrode and formed of a thick film resistor. A second resistance layer may be formed to be connected to the first resistance layer and the second internal electrode and formed of a thin film resistor. A first external electrode and a second external electrode may be formed on the first internal electrode and the second internal electrode, respectively.

According to another aspect of the present disclosure, a resistor element assembly may include a printed circuit board having first and second electrode pads thereon and a resistor element on the printed circuit board. The resistor element may include a first and second terminals on opposite end portions of a base substrate, respectively. A first resistance layer may be electrically connected to the first terminal and comprise a thick film resistor. A second resistance layer may be electrically connected to the first resistance layer and the second terminal and comprise a thin film resistor.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings.

Figure 1:
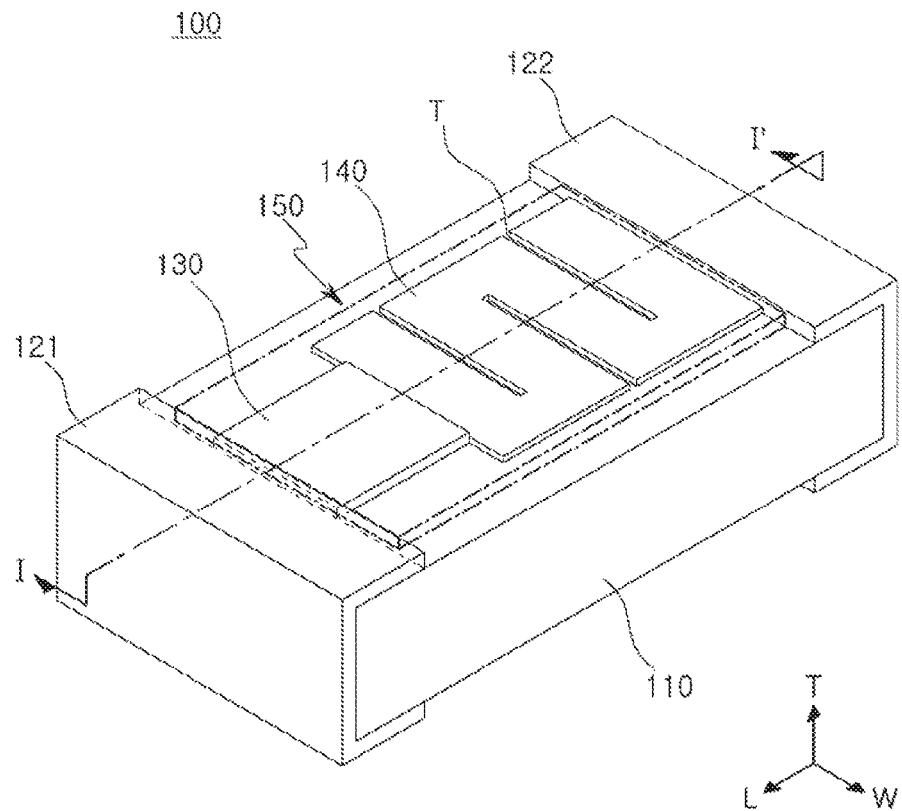
FIG. 1 is a perspective view illustrating a resistor element according to an exemplary embodiment in the present disclosure.
Figure 2:
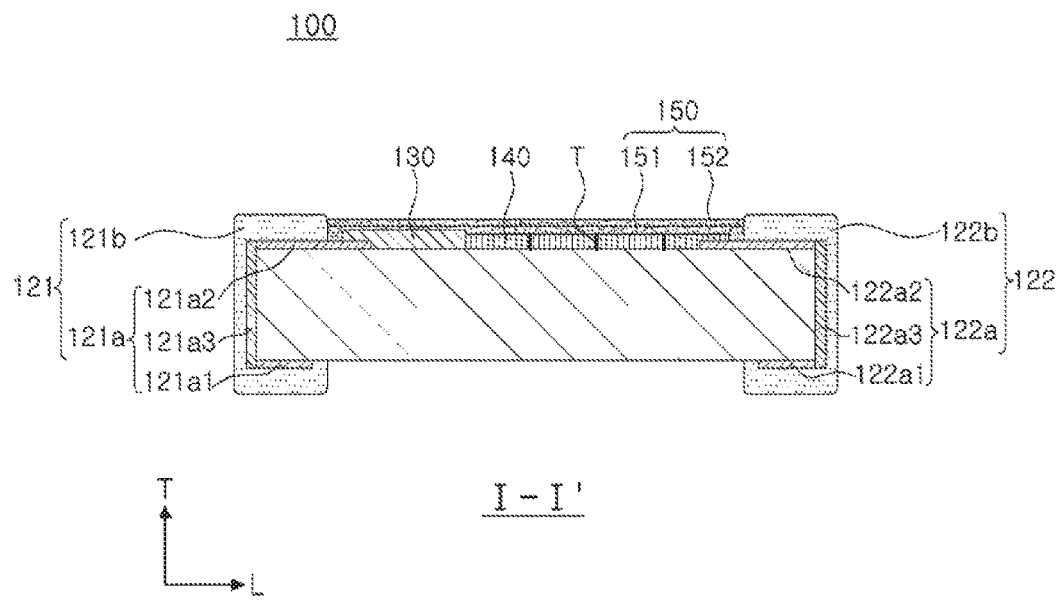
FIG. 2 is a cross-sectional view taken along line I-I' of FIG. 1.

FIG. 1 is a perspective view illustrating a resistor element according to an example embodiment in the present disclosure. FIG. 2 is a cross-sectional view taken along line I-I' of FIG. 1. Referring to FIGS. 1 and 2, a resistor element 100 may include a base substrate 110, a first terminal 121, a second terminal 122, a first resistance layer 130, and a second resistance layer 140. FIGS. 1 and 2 illustrate an exemplary embodiment in which the first resistance layer 130 and the second resistance layer 140 are disposed on one surface of the base substrate 100.

The base substrate 110 may support the first resistance layer 130 and the second resistance layer 140, and secure strength of the resistor element 100. The base substrate 110 may have a predetermined thickness and may have a thin plate shape that has first and second surfaces opposing each other and each having a rectangular thin plate shape, but is not limited thereto. The base substrate 110 may be formed of a material having excellent thermal conductivity, and may effectively dissipate externally heat generated from the first resistance layer 130 and the second resistance layer 140 when a current and a voltage are applied to the resistor element.

The base substrate 110 may be formed of a ceramic material such as alumina ($Al_2O_3$) or a polymer. In particular, the base substrate 110 may be an alumina substrate obtained by anodizing a surface of thin plate-shaped aluminum.

As illustrated in FIG. 1, the first terminal 121 and the second terminal 122 may be disposed on opposite end portions of the base substrate 110, respectively. The first terminal 121 and the second terminal 122 may be formed to surround opposite end portions of the base substrate 110, respectively. Since the first terminal 121 and the second terminal 122 are connected to opposing end portions of the first resistance layer 130 and the second resistance layer 140 bonded to each other, respectively, the first terminal 121 and the second terminal 122 may be electrically connected to each other by a path of a series structure formed by the first resistance layer 130 and the second resistance layer 140. The first terminal 121 and the second terminal 122 will be described in more detail with reference to FIG. 2.

The first resistance layer 130 and the second resistance layer 140 may be disposed on one surface of the base substrate 110. The first resistance layer 130 and the second resistance layer 140 may be disposed between the first terminal 121 and the second terminal 122, which are spaced apart from each other, and may be connected to the first terminal 121 and the second terminal 122, respectively, to be thus used as resistance elements. The first resistance 130 may be connected to the first terminal 121, and the second resistance layer 140 may be disposed between the first resistance layer 130 and the second terminal 122 and be connected to the first resistance layer 130 and the second terminal 122. The first resistance layer 130 and the second resistance layer 140 may be bonded to each other.

In the exemplary embodiment in the present disclosure, the first resistance layer 130 may be a thick film resistor, and the second resistance layer 140 may be a thin film resistor. For example, the first resistance layer 130 being a thick film resistor may contain ruthenium oxide ($RuO_2$) as a conductive particle and may be bonded to the base substrate through a process of printing and then firing a paste further including glass.

The second resistance layer 140 being a thin film resistor may contain at least one of a nickel chromium (NiCr) alloy, a titanium nitride (TiN) alloy, and a tantalum nitride (TaN) alloy, and may be bonded to the base substrate through a sputtering process.

The resistance value of the resistor element 100 may be determined by a trimming process for the first resistance layer 130 and the second resistance layer 140. The trimming process refers to a process of partially removing a resistance layer through fine cutting, or the like, of the resistance layer using a laser beam in order to obtain a resistance value required for the design of the circuit after the resistance layer is formed.

In the trimming process, a groove is formed while measuring the resistance value of the resistor element. When the measured resistance value arrives at a target resistance value, the process of forming the groove is stopped, such that the resistance value of the resistor element is adjusted. FIGS. 1 and 2 illustrate grooves T formed in the second resistance layer 140 by a trimming process. Although not illustrated, grooves may be formed in the first resistance layer 130 having the same function as that of the grooves T formed in the second resistance layer 140. When the trimming process is performed for the grooves in the first resistance layer 130, the resistance value of the resistor element may be adjusted by performing the trimming process for the second resistance layer 140 after the trimming process for the first resistance layer 130.

Since the resistive material constituting the thin film resistor of the second resistance layer 140 has a low specific resistance value, the resistive material constituting the thin film resistor may be advantageous for manufacturing a resistor element having a minute resistance value. In addition, since the resistive material constituting the thin film resistor has a low temperature coefficient of resistivity (TCR), the resistive material constituting the thin film resistor may allow the thin film resistor to have a more precise resistance value in the trimming process and allow the resistor element to have robustness against temperature.

As described above, since the resistor element according to the exemplary embodiment in the present disclosure includes a thick film resistor that can have a high resistance value, the resistor element may be manufactured to have resistance values in various ranges. In addition, since the resistor element according to the exemplary embodiment in the present disclosure includes a thin film resistor that has a precise resistance value and a low TCR, the resistor element can have high precision and reliability.

A protective layer 150 may be disposed on surfaces of the first resistance layer 130 and the second resistance layer 140. The protective layer 150 may be disposed between the first terminal 121 and the second terminal 122, may prevent the first resistance layer 130 and the second resistance layer 140 from being externally exposed, and may protect the first resistance layer 130 and the second resistance layer 140 from external impacts. For example, the protective layer 150 may include silicon ($SiO_2$), glass, or polymer.

Referring to FIG. 2, the protective layer 150 may include a first protective layer 151 formed of glass and a second protective layer 152 formed of polymer. The first protective layer 151 may be formed before the trimming process to prevent the generation of cracks in the first and second resistance layers 130 and 140 during the trimming process. The second protective layer 152 may be formed after the trimming process to protect the first resistance layer 130 and the second resistance layer 140.

Even though the protective layer 150 is disposed on the second resistance layer 140, the first and second terminals 121 and 122 may protrude further as compared to the protective layer 150, such that the first and second terminals 121 and 122 and electrode pads disposed on a circuit board may be easily in contact with each other when mounting the resistor element on the circuit board.

An example of the first terminal 121 and the second terminal 122 will hereinafter be described in more detail with reference to FIG. 2.

For example, the first terminal 121 may include a first internal electrode 121a and a first external electrode 121b. Likewise, the second terminal 122 may include a second internal electrode 122a and a second external electrode 122b.

The first internal electrode 121a and the second internal electrode 122a may be disposed on opposite end portions of the base substrate 110, respectively. The first external electrode 121b and the second external electrode 122b may be disposed on the first internal electrode 121a and the second internal electrode 122a, respectively. That is, the first external electrode 121b may cover at least portions of a surface of the first internal electrode 121a, and the second external electrode 122b may cover at least portions of a surface of the second internal electrode 122a.

The first internal electrode 121a may include a first seed electrode 121a1 and a first backside electrode 121a2. Likewise, the second internal electrode 122a may include a second seed electrode 122a1 and a second backside electrode 122a2.

The first seed electrode 121a1 and the second seed electrode 122a1 may be disposed on the first, lower surface of the base substrate 110. The first backside electrode 121a2 and the second backside electrode 122a2 may be disposed on a second, upper surface of the base substrate 110 opposing the first surface of the base substrate 110. The first seed electrode 121a1 may face the first backside electrode 121a2, and the second seed electrode 122a1 may face the second backside electrode 122a2.

As illustrated in FIG. 2, the first backside electrode 121a2 may be connected to the first resistance layer 130, and the second backside electrode 122a2 may be connected to the second resistance layer 140.

The first internal electrode 121a may further include a first side electrode 121a3, and the second internal electrode 122a may further include a second side electrode 122a3. The first side electrode 121a3 and the second side electrode 122a3 may be disposed, respectively, on opposite end surfaces of a laminate formed by stacking the base substrate 110, the first resistance layer 130, the second resistance layer 140, the first and second seed electrodes 121a1 and 122a1, and the first and second backside electrodes 121a2 and 122a2.

The first side electrode 121a3 may be disposed to be connected to the first seed electrode 121a1 and the first backside electrode 121a2, and the second side electrode 122a3 may be disposed to be connected to the second seed electrode 122a1 and the second backside electrode 122a2. When the first internal electrode 121a includes the first side electrode 121a3 and the second internal electrode 122a includes the second side electrode 122a3, the first and second external electrodes 121b and 122b may also be formed on the first and second side electrodes 121a3 and 122a3, respectively.

Figure 3:
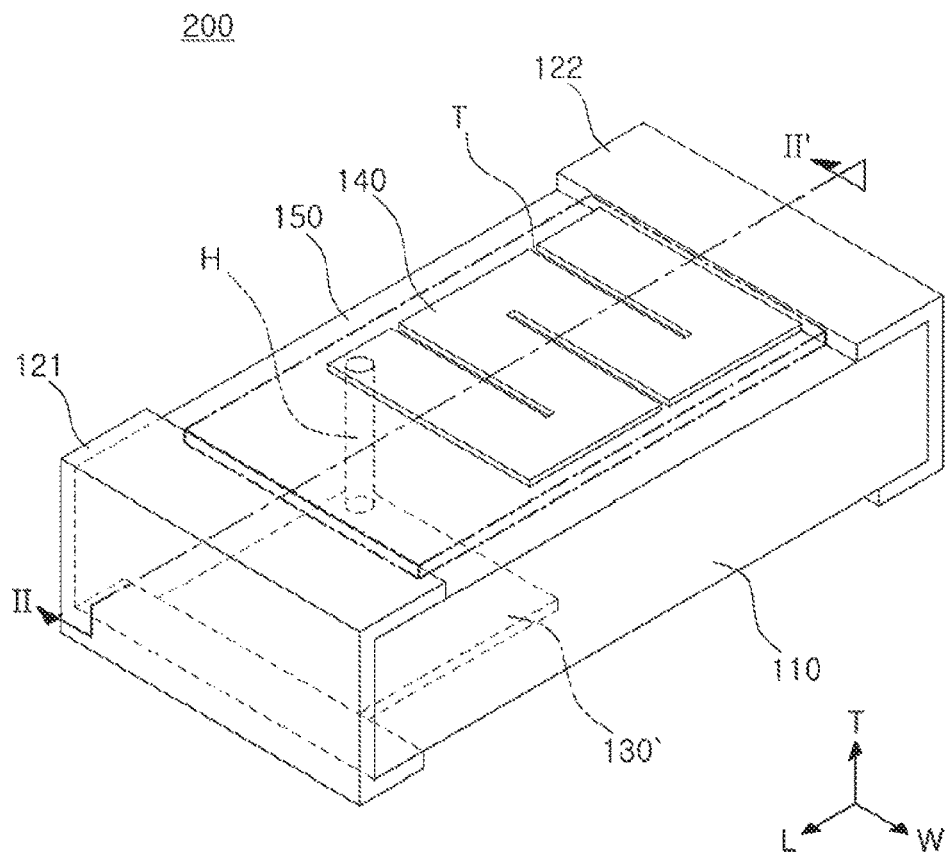
FIG. 3 is a perspective view illustrating a resistor element according to another exemplary embodiment in the present disclosure.
Figure 4:
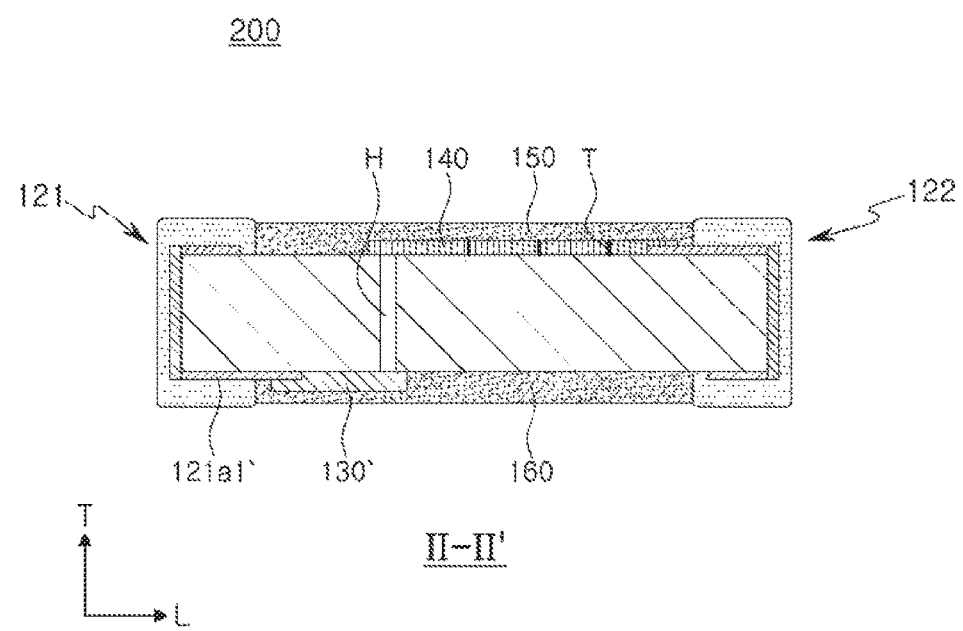
FIG. 4 is a cross-sectional view taken along line II-II' of FIG. 3.

FIG. 3 is a perspective view illustrating a resistor element according to another exemplary embodiment in the present disclosure. FIG. 4 is a cross-sectional view taken along line II-II' of FIG. 3.

A resistor element 200 illustrated in FIGS. 3 and 4 may be understood to be similar to the resistor element 100 illustrated in FIGS. 1 and 2, except that a first resistance layer 130' is disposed on the first, lower surface of the base substrate 110, and the resistor element 200 includes a conductive via H. The components of the resistor element 200 according to the present exemplary embodiment may be understood with reference to the description for the same or similar components of the resistor element 100 illustrated in FIGS. 1 and 2, unless explicitly described to the contrary, and overlapping descriptions are omitted.

Referring to FIGS. 3 and 4, the first resistance layer 130' of the resistor element 200 may be disposed on the first surface of the base substrate 110, and the second resistance layer 140 may be disposed on the second surface of the base substrate 110 opposing the first surface. The first resistance layer 130' may be connected to the first terminal 121 on the first surface, and the second resistance layer 140 may be connected to the second terminal 122 on the second surface. As illustrated in FIG. 4, a first seed electrode 121a1' included in the first terminal 121 may be connected to the first resistance layer 130'. The first resistance layer 130' and the second resistance layer 140 may be connected to each other by the conductive via H penetrating through the base substrate.

A first protective layer 160 may be disposed on a surface of the first resistance layer 130', and a second protective layer 150 may be disposed on a surface of the second resistance layer 140.

FIGS. 3 and 4 illustrate the resistor element 200 with the conductive via H having a through-hole form penetrating through the base substrate 110, but the resistor element may include a groove provided in a side surface of the base substrate 110 instead of the conductive via H. Such an exemplary embodiment is illustrated in FIG. 5.

Figure 5:
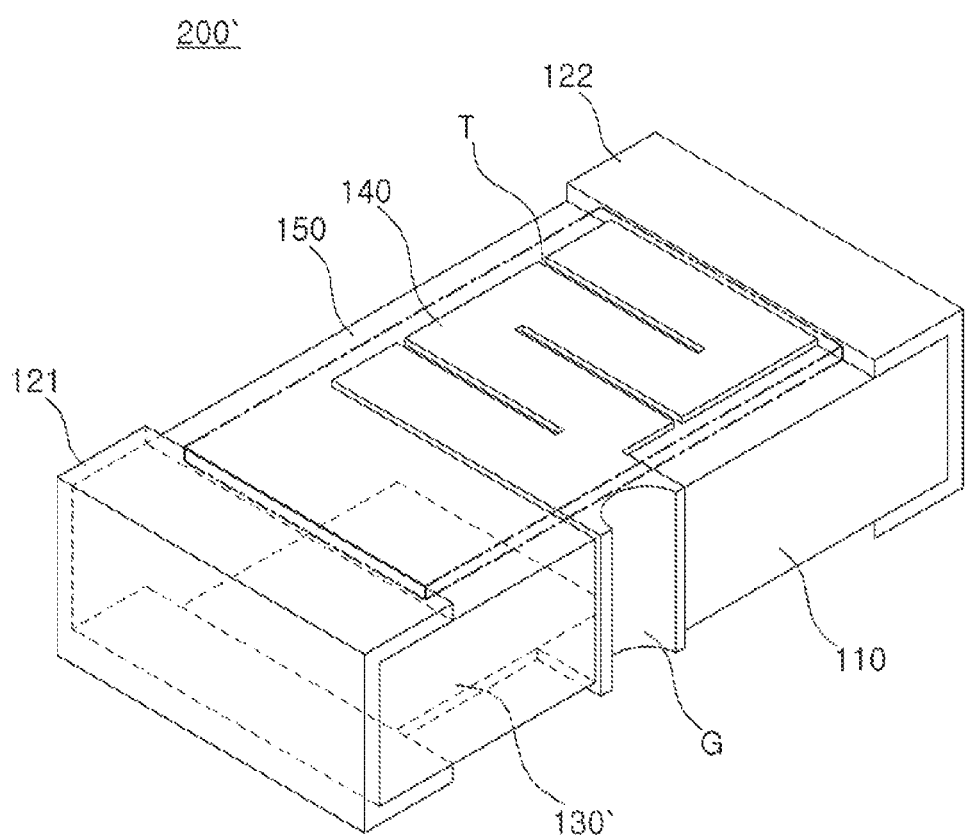
FIG. 5 is a perspective view illustrating a resistor element according to another exemplary embodiment in the present disclosure.

FIG. 5 is a perspective view illustrating a resistor element according to another exemplary embodiment in the present disclosure. The resistor element 200' illustrated in FIG. 5 may be similar to the resistor element 200 illustrated in FIGS. 3 and 4, except that a groove G in a side surface of the base substrate is formed instead of the conductive via H (see FIG. 3). The components of the resistor element 200' according to the present exemplary embodiment may be understood with reference to the description for the same or similar components of the resistor element 100 illustrated in FIGS. 1 and 2 and the resistor element 200 illustrated in FIGS. 3 and 4, unless explicitly described to the contrary, and overlapping descriptions are omitted.

Referring to FIG. 5, a first resistance layer 130' of the resistor element 200' may be disposed on a first surface of the base substrate 110, and a second resistance layer 140 may be disposed on a second surface of the base substrate 110 opposing the first surface.

As compared to the resistor element 200 illustrated in FIG. 3, the resistor element 200' may include a groove G provided in the side surface of the base substrate 110, instead of the conductive via H. The first resistance layer 130' and the second resistance layer 140 may be connected to each other by the groove G. The side surface of the base substrate in which the groove G is formed may be positioned perpendicular to a direction in which the first terminal 121 and the second terminal 122 are arranged. The groove G according to the present exemplary embodiment may have a semicircular shape when viewed in a cross section in a horizontal direction, but is not limited thereto.

Figure 6:
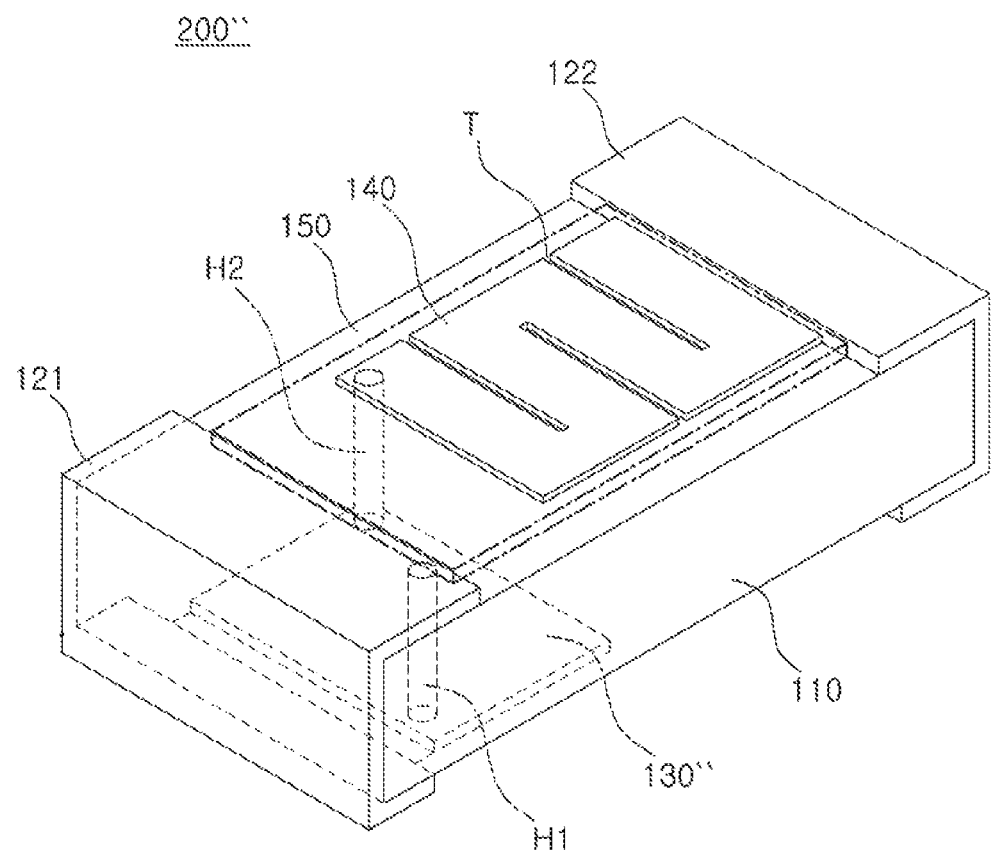
FIG. 6 is a perspective view illustrating a resistor element according to another exemplary embodiment in the present disclosure.

FIG. 6 is a perspective view illustrating a resistor element according to another exemplary embodiment in the present disclosure. The resistor element 200" illustrated in FIG. 6 may be similar to the resistor element 200 illustrated in FIGS. 3 and 4, except that it further includes a conductive via H1 connecting a first terminal 121 and a first resistance layer 130". The components of the resistor element 200" according to the present exemplary embodiment may be understood with reference to the description of the same or similar components of the resistor element 100 illustrated in FIGS. 1 and 2 and the resistor element 200 illustrated in FIGS. 3 and 4, unless explicitly described to the contrary, and overlapping descriptions are omitted.

Referring to FIG. 6, the first resistance layer 130" of the resistor element 200" may be disposed on a first surface of a base substrate 110, and a second resistance layer 140 may be disposed on a second surface of the base substrate 110 opposing the first surface. As compared to the resistor element 200 illustrated in FIG. 3, the first resistance layer 130″ may be disposed such that it is not connected to the first terminal 121 on the first surface. The resistor element 200″ may further include the first conductive via H1 penetrating through the base substrate 110, with the first resistance layer 130″ connected to the first terminal 121 through the first conductive via H1.

The first resistance layer 130″ and the second resistance layer 140 may be connected to each other by a second conductive via H2 penetrating through the base substrate.

As described above with reference to FIGS. 3 through 6, the first resistance layer 130′ and the second resistance layer 140 may be disposed on different surfaces. As such, that the first resistance layer 130′ and the second resistance layer 140 may be formed by separate processes, and interference between the first resistance layer 130′ and the second resistance layer 140, which could be generated when a current and a voltage is applied to the resistor element, may be significantly reduced. In addition, interference of the first resistance layer 130′ with the second resistance layer 140 that may be generated when grooves T are formed in the second resistance layer 140 by a trimming process may be significantly reduced.

Figure 7:
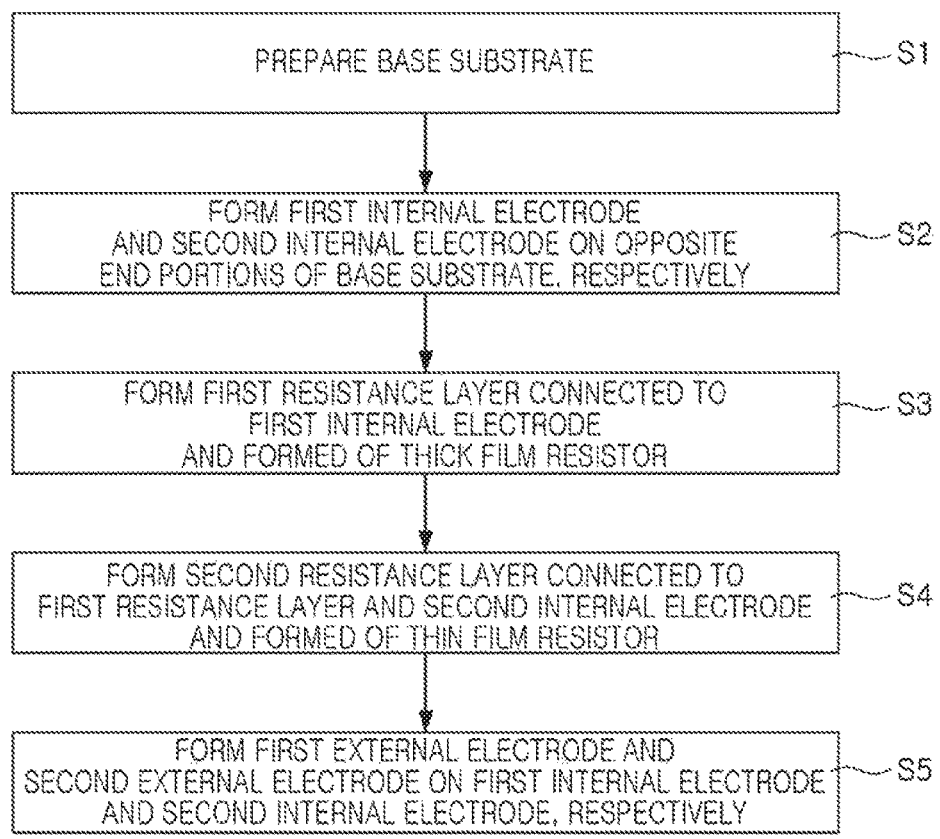
FIG. 7 is a flow chart illustrating a method of manufacturing a resistor element according to an exemplary embodiment in the present disclosure.

FIG. 7 is a flow chart illustrating a method of manufacturing a resistor element according to an exemplary embodiment in the present disclosure.

The method of manufacturing a resistor element according to the example embodiment in the present disclosure may include preparing a base substrate (S1), forming a first internal electrode and a second internal electrode on opposite end portions of the base substrate, respectively (S2), forming a first resistance layer connected to the first internal electrode and formed of a thick film resistor (S3), forming a second resistance layer connected to the first resistance layer and the second internal electrode and formed of a thin film resistor (S4), and forming a first external electrode and a second external electrode on the first internal electrode and the second internal electrode, respectively (S5). The sequence of S2 to S4 is provided by way of example, and may be a different sequence. The method of manufacturing a resistor element may further include measuring resistance between the first internal electrode and the second internal electrode and trimming the second resistance layer.

The method of manufacturing a resistor element according to the example embodiment in the present disclosure will hereinafter be described with reference to FIGS. 1, 2, and 7. A description for the same or similar contents as the features of the resistor elements according to the exemplary embodiments in the present disclosure described above is omitted.

First, the base substrate 110 on which the resistance layers and the electrodes are disposed may be prepared (S1). The base substrate 110 may be prepared at a size at which a plurality of resistor elements may be formed, and may be diced in the form of individual resistor elements before the forming (S5) of the first external electrode and the second external electrode.

The first internal electrode 121a and the second internal electrode 122a may be formed in step S2. The first internal electrode 121a and the second internal electrode 122a may be formed by a process of printing a conductive paste or a process of sputtering the conductive paste. The first internal electrode 121a and the second internal electrode 122a may serve as seeds in a plating process for the first external electrode 121b and the second external electrode 122b. The internal electrodes may include, for example, at least one of silver (Ag), copper (Cu), nickel (Ni), and platinum (Pt).

The first resistance layer 130 formed of the thick film resistor may be formed in step S3. The thick film resistor may be bonded to the base substrate through a process of printing and then firing a paste containing a ruthenium oxide, for example.

The second resistance layer 140 formed of the thin film resistor may be formed in step S4. The thin film resistor may contain, for example, at least one of a nickel chromium (NiCr) alloy, a titanium nitride (TiN) alloy, and a tantalum nitride (TaN) alloy, and may be bonded to the base substrate through a sputtering process.

The first resistance layer 130 and the second resistance layer 140 may be formed on one surface of the base substrate. The first resistance layer 130 and the second resistance layer 140 may be bonded and connected to each other, or may be connected to each other by a connection electrode disposed therebetween.

The first external electrode 121b and the second external electrode 122b may be formed on the first internal electrode 121a and the second internal electrode 122a, respectively, in step S5. The first external electrode 121b and the second external electrode 122b may be formed on the first internal electrode 121a and the second internal electrode 122a, respectively, by a plating process. The first external electrode 121b and the second external electrode 122b may be formed after the protective layer 150 is formed.

The first external electrode 121b and the second external electrode 122b may include, for example, at least one of nickel (Ni), tin (Sn), copper (Cu), and chromium (Cr). Each of the first external electrode 121b and the second external electrode 122b may include, for example, a double layer of a nickel (Ni) plating layer and a tin (Sn) plating layer, and may further include a copper (Cu) plating layer. The nickel (Ni) plating layer may prevent a component (for example, Ag) of the internal electrode from leaching into a solder component at the time of mounting the resistor element, and the tin (Sn) plating layer may be provided to be easily bonded to the solder component at the time of mounting the resistor element. The copper (Cu) plating layer may improve conductivity of the internal electrode.

A trimming process of measuring resistance values of the first resistance layer 130 and the second resistance layer 140 disposed between the first internal electrode and the second internal electrode and adjusting the resistance values may be performed before the forming step S5. The grooves T may be formed in the first resistance layer 130 and the second resistance layer 140 in the trimming process.

Figure 8:
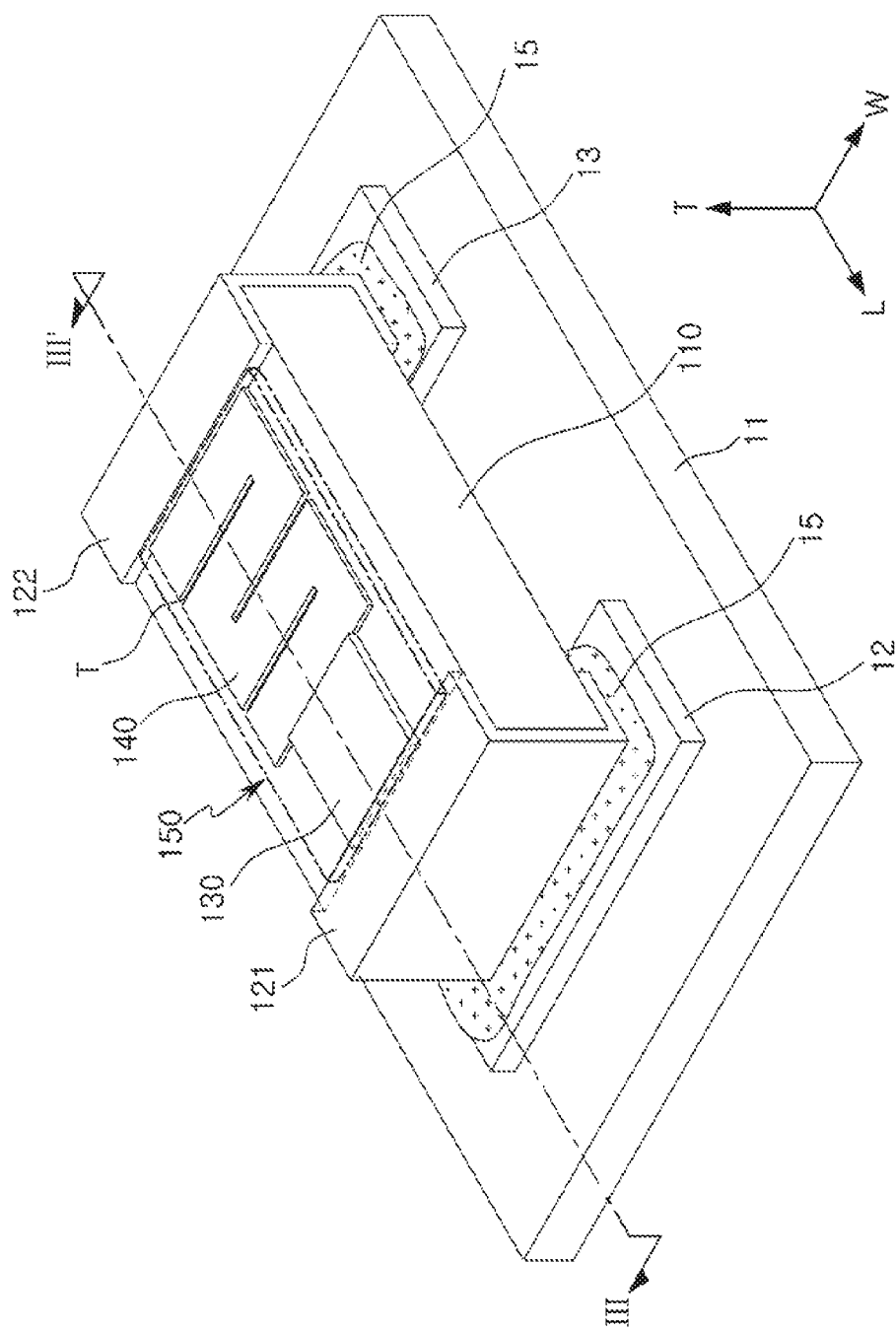
FIG. 8 is a perspective view illustrating a resistor element assembly according to an exemplary embodiment in the present disclosure.
Figure 9:
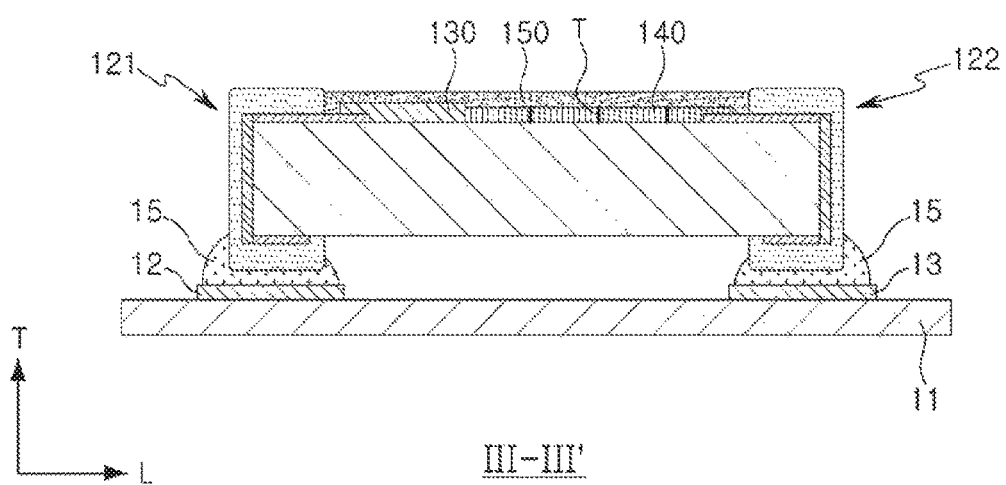
FIG. 9 is a cross-sectional view taken along line III-III' of FIG. 8.

FIG. 8 is a perspective view illustrating a resistor element assembly according to an exemplary embodiment in the present disclosure. FIG. 9 is a cross-sectional view taken along line III-III′ of FIG. 8.

Referring to FIGS. 8 and 9, the resistor element assembly may include a circuit board 11 on which the resistor element illustrated in FIGS. 1 and 2 is mounted. However, the resistor element assembly is not limited thereto, and may also include circuit boards on which the resistor elements illustrated in FIGS. 3 through 6 are mounted.

The circuit board 11 may include first and second electrode pads 12 and 13 disposed in a mounted region of the resistor element. The first and second electrode pads 12 and 13 refer to land patterns connected to circuit patterns implemented on the circuit board 11 and provided in order to mount the resistor element.

The resistor element may include a base substrate 110, a first terminal 121 and a second terminal 122, respectively disposed on opposite end portions of the base substrate 110, a first resistance layer 130 connected to the first terminal 121 and formed of a thick film resistor, and a second resistance layer 140 connected to the first resistance layer 130 and the second terminal 122 and formed of a thin film resistor. The resistor element may further include a protective layer 150.

As described above, since the second resistance layer 140 of the resistor element has a low specific resistance and a low temperature coefficient of resistivity (TCR), the resistor element may have robustness against temperature and may have a more precise resistance value. In addition, since the resistor element further includes the first resistance layer 130, the resistor element may be manufactured to have resistance values (for example, 100 KΩ or more) in various ranges that are difficult to implement by only the second resistance layer 140.

The circuit board 11 may have an electronic circuit formed thereon, and an integrated circuit (IC) for a specific operation or control of an electronic device, or the like, may be formed on the circuit board 11, such that a current supplied from a separate power supply may flow to the circuit board 11.

The circuit board 11 may include various wiring lines or further include other kinds of semiconductor elements such as a transistor, and the like. The circuit board 11 may be variously configured, as necessary. For example, the circuit board 11 may include a conductive layer or include a dielectric layer.

The first and second electrode pads 12 and 13 may be disposed on the circuit board 11 to be spaced from each other, and may be connected, respectively, to the first and second terminals 121 and 122 of the resistor element 100 by solders 15.

FIGS. 8 and 9 illustrate the first electrode pad 12 connected to the first terminal 121 and the second electrode pad 13 connected to the second terminal 122, but the first electrode pad 12 may be connected to the second terminal 122 and the second electrode pad 13 may be connected to the first terminal 121, depending on the design.

As set forth above, the resistor element and the resistor element assembly according to the exemplary embodiment in the present disclosure may include the thick film resistor that may have a high resistance value and the thin film resistor that has a low temperature coefficient of resistivity (TCR) and a low specific resistance value to thus provide a high resistance value while maintaining precision.

In addition, according to the exemplary embodiment in the present disclosure, the method of manufacturing the resistor element described above may be provided.

While example embodiments have been shown and described above, it will be apparent to those skilled in the art that modifications and variations could be made without departing from the scope of the present invention as defined by the appended claims.

What is claimed is:

1. A resistor element comprising: a first terminal and a second terminal on opposite end portions of a base substrate, respectively; a first resistance layer electrically connected to the first terminal, comprising a thick film resistor; and a second resistance layer electrically connected to the first resistance layer and to the second terminal, comprising a thin film resistor, wherein the first resistance layer is on a first surface of the base substrate, and the second resistance layer is on a second surface of the base substrate opposing the first surface, wherein the first resistance layer and the second resistance layer are electrically connected to each other by a conductive via penetrating through the base substrate, and wherein the thick film resistor contains a ruthenium (Ru) oxide, and the thin film resistor contains at least one of a nickel chromium (NiCr) alloy, a titanium nitride (TiN) alloy, and a tantalum nitride (TaN) alloy.

2. The resistor element of claim 1, wherein the first resistance layer and the second resistance layer are bonded to each other on one surface of the base substrate.

3. The resistor element of claim 1, wherein at least one of the first terminal and the second terminal is electrically connected to at least one of the first resistance layer and the second resistance layer by a conductive via.

4. The resistor element of claim 1, wherein the second resistance layer is trimmed, whereby a resistance value of the resistor element is established by carrying out a trimming process of the second resistance layer.

5. The resistor element of claim 1, wherein the first resistance layer is a printed and fired layer, and the second resistance layer is a sputtered layer.

6. A method of manufacturing a resistor element, comprising: preparing a base substrate; forming a first internal electrode and a second internal electrode on opposite end portions of the base substrate, respectively; forming a first resistance layer electrically connected to the first internal electrode and formed of a thick film resistor; forming a second resistance layer electrically connected to the first resistance layer and to the second internal electrode and formed of a thin film resistor; forming a first external electrode and a second external electrode on the first internal electrode and the second internal electrode, respectively; and forming a conductive via penetrating through the base substrate to connect the first resistance layer and the second resistance layer to each other, wherein the first resistance layer is formed on a first surface of the base substrate, and the second resistance layer is formed on a second surface of the base substrate opposing the first surface, wherein the thick film resistor contains a ruthenium (Ru) oxide, and the thin film resistor contains at least one of a nickel chromium (NiCr) alloy, a titanium nitride (TiN) alloy, and a tantalum nitride (TaN) alloy.

7. The method of claim 6, wherein the first resistance layer and the second resistance layer are formed to be bonded to each other on one surface of the base substrate.

8. The method of claim 6, further comprising the steps of: measuring a resistance between the first internal electrode and the second internal electrode; and trimming the second resistance layer so that the measured resistance reaches a target resistance for the resistor element.

9. The method of claim 6, wherein the first resistance layer is formed by a printing and firing process, and the second resistance layer is formed by a sputtering process.

10. A resistor element assembly comprising: a printed circuit board having first and second electrode pads thereon; and a resistor element on the printed circuit board, wherein the resistor element includes a first terminal and a second terminal on opposite end portions of a base substrate, respectively, a first resistance layer electrically connected to the first terminal and comprising a thick film resistor, and a second resistance layer electrically connected to the first resistance layer and the second terminal and comprising a thin film resistor, wherein the first resistance layer is on a first surface of the base substrate, and the second resistance layer is on a second surface of the base substrate opposing the first surface, wherein the first resistance layer and the second resistance layer are electrically connected to each other by a conductive via penetrating through the base substrate, and wherein the thick film resistor contains a ruthenium (Ru) oxide, and the thin film resistor contains at least one of a nickel chromium (NiCr) alloy, a titanium nitride (TiN) alloy, and a tantalum nitride (TaN) alloy.

11. A resistor element comprising: a base substrate; a thin film resistor on a first portion of an upper surface of the base substrate; a thick film resistor on a second portion of the upper surface of the base substrate and in contact with the thin film resistor; a first terminal in contact with the thin film resistor on at least a first side surface of the base substrate connected to the upper surface of the base substrate; and a second terminal in contact with the thick film resistor on at least a second side surface of the base substrate connected to the upper surface of the base substrate and opposing the first side surface; a first protective layer covering at least the thin film resistor; a second protective layer covering the first protective layer; and grooves in the first protective layer and the thin film resistor, wherein the thick film resistor contains a ruthenium (Ru) oxide, and the thin film resistor contains at least one of a nickel chromium (NiCr) alloy, a titanium nitride (TiN) alloy, and a tantalum nitride (TaN) alloy.

12. The resistor element of claim 11, wherein the first protective layer includes glass and the second protective layer includes polymer.

13. The resistor element of claim 11, wherein: the first terminal includes: a first internal electrode on the upper surface of the base substrate, between the base substrate and the thin film resistor, and on the first side surface of the base substrate, and a first external electrode on the upper surface of a portion of the first internal electrode on the upper surface of the base substrate and on a portion of the first internal electrode on the first side surface of the base substrate the second terminal includes: a second internal electrode on the upper surface of the base substrate, between the base substrate and the thick film resistor, and on the second side surface of the base substrate, and a second external electrode on the upper surface of a portion of the second internal electrode on the upper surface of the base substrate and on a portion of the second internal electrode on the second side surface of the base substrate.

14. A resistor element comprising: a base substrate; a thin film resistor on a first surface of the base substrate; a thick film resistor on a second surface of the base substrate opposing the first surface of the base substrate; and first and second terminals on first and second side surfaces of the base substrate, opposing each other and each connecting the first surface to the second surface, the first and second terminals electrically connected to the thin film resistor and thick film resistor, respectively, wherein the thin film resistor is electrically connected to the thick film resistor by a first conductive via within the base substrate; and wherein the thick film resistor contains a ruthenium (Ru) oxide, and the thin film resistor contains at least one of a nickel chromium (NiCr) alloy, a titanium nitride (TiN) alloy, and a tantalum nitride (TaN) alloy.

15. The resistor element of claim 14, wherein the thin film resistor is electrically connected to the thick film resistor by an electrode connected to the thin film resistor on the first surface of the base substrate, connected to the thick film resistor on the second surface of the base substrate, and within a groove on a third side surface of the base substrate connecting the first surface to the second surface and connecting the first side surface to the second side surface.

16. The resistor element of claim 15, further comprising: a second conductive via within the base substrate electrically connecting the thick film resistor to a portion of the second terminal on the first surface of the base substrate, wherein the thick film resistor is not in contact with the second terminal on the second surface of the base substrate.

* * * * *